United States Patent
Hanshew

(10) Patent No.: US 10,884,272 B2
(45) Date of Patent: Jan. 5, 2021

(54) ENERGY-COLLECTING TOUCHSCREEN UNIT

(71) Applicant: Garmin Switzerland GmbH, Schaffhausen (CH)

(72) Inventor: Christopher J. Hanshew, Lenexa, KS (US)

(73) Assignee: Garmin Switzerland GmbH

( * ) Notice: Subject to any disclaimer, the term of this patent is extended or adjusted under 35 U.S.C. 154(b) by 0 days.

(21) Appl. No.: 16/451,540

(22) Filed: Jun. 25, 2019

(65) Prior Publication Data

US 2020/0124892 A1    Apr. 23, 2020

Related U.S. Application Data

(60) Provisional application No. 62/746,966, filed on Oct. 17, 2018.

(51) Int. Cl.
| | |
|---|---|
| *G02F 1/133* | (2006.01) |
| *G06F 3/044* | (2006.01) |
| *G06F 1/16* | (2006.01) |
| *G02F 1/1333* | (2006.01) |
| *G03G 21/08* | (2006.01) |
| *G04C 10/02* | (2006.01) |
| *H02S 99/00* | (2014.01) |
| *G04G 21/08* | (2010.01) |

(52) U.S. Cl.
CPC ...... *G02F 1/13306* (2013.01); *G02F 1/13338* (2013.01); *G04C 10/02* (2013.01); *G04G 21/08* (2013.01); *G06F 1/163* (2013.01); *G06F 3/044* (2013.01); *H02S 99/00* (2013.01); *G02F 2001/13324* (2013.01); *G02F 2203/02* (2013.01)

(58) Field of Classification Search
CPC ............ G02F 1/13306; G02F 1/13338; G02F 2001/13324; G02F 2201/56; G02F 2203/02; G02F 2203/09; G04C 10/02; G04G 21/08; G04G 9/0094; G06F 1/163; G06F 3/0412; G06F 3/044; G09G 3/00; H02S 99/00

See application file for complete search history.

(56) References Cited

U.S. PATENT DOCUMENTS

| | | |
|---|---|---|
| 9,787,934 B2 | 10/2017 | Lang |
| 10,509,500 B2 | 12/2019 | Lai et al. |
| 2008/0198294 A1* | 8/2008 | Hwang ............... G02F 1/09 349/62 |
| 2010/0079387 A1* | 4/2010 | Rosenblatt ............ G06F 1/1643 345/173 |
| 2011/0157034 A1* | 6/2011 | Chen ................... H04M 1/0266 345/173 |

(Continued)

*Primary Examiner* — Hong Zhou
(74) *Attorney, Agent, or Firm* — Samuel M. Korte; Max M. Ali

(57) ABSTRACT

Techniques are disclosed to enable an energy-collecting touchscreen unit having a thin, substantially transparent cover layer through which a viewing area within the touchscreen unit can be observed while protecting the touchscreen unit from physical damage. The touchscreen unit has a common base layer disposed beneath the cover layer, and it has at least one touch sensor and a photovoltaic surface. The touch sensor and the photovoltaic surface are affixed to opposite faces of the common base layer. The touchscreen unit also includes an electrical interconnection with both the photovoltaic surface and the touch sensor.

18 Claims, 6 Drawing Sheets

(56) References Cited

U.S. PATENT DOCUMENTS

| | | | |
|---|---|---|---|
| 2012/0057439 A1* | 3/2012 | Shimizu | H01L 31/0504 |
| | | | 368/205 |
| 2014/0133074 A1* | 5/2014 | Zahler | H04M 1/0266 |
| | | | 361/679.01 |
| 2014/0152632 A1* | 6/2014 | Shedletsky | G01J 1/4204 |
| | | | 345/207 |
| 2015/0083195 A1 | 3/2015 | Gilbert | |
| 2015/0199062 A1* | 7/2015 | Lang | G06F 3/044 |
| | | | 345/174 |
| 2015/0253914 A1* | 9/2015 | Hamada | B32B 17/064 |
| | | | 345/173 |
| 2016/0054825 A1* | 2/2016 | Fried | H05K 1/0278 |
| | | | 345/173 |
| 2016/0126407 A1 | 5/2016 | Cardi et al. | |
| 2016/0211397 A1 | 7/2016 | Kerzabi | |
| 2017/0242172 A1 | 8/2017 | Kerzabi et al. | |
| 2018/0032185 A1* | 2/2018 | Zeng | G06F 3/044 |
| 2018/0261704 A1* | 9/2018 | Jacobs | G04G 21/00 |
| 2019/0006546 A1 | 1/2019 | Boubekri | |

\* cited by examiner

ENERGY-COLLECTING TOUCHSCREEN UNIT

BACKGROUND

Conventional wearable electronic devices, like smartwatches, GPS navigation devices, fitness trackers, etc. utilize touchscreens to provide a user interface to users of the electronic devices. Battery life is important for these devices as it is aggravating for users to stop wearing a device for recharging. Some attempts have been made to equip smartwatches with semitransparent solar panels such as by using a discrete solar cell positioned on top of (or over) the watch's display. However, the presence of the solar cell degrades visibility of the device. For instance, if solar panel transmittance is 75%, meaning it absorbs and/or scatters 25% of the light incident on it, the corresponding viewability is substantially impeded, causing a tradeoff that either results in a viewing area that is either not very bright or otherwise visible or a solar panel that does not collect very much energy.

SUMMARY

Techniques are disclosed to enable an energy-collecting touchscreen unit having a thin, substantially transparent cover layer through which a viewing area within the touchscreen unit can be observed while protecting the touchscreen unit from physical damage. The touchscreen unit has a common base layer disposed beneath the cover layer, and it has at least one touch sensor and a photovoltaic surface. The touch sensor and the photovoltaic surface are affixed to opposite faces of the common base layer. The touchscreen unit also includes an electrical interconnection with both the photovoltaic surface and the touch sensor.

BRIEF DESCRIPTION OF THE DRAWINGS

The figures described below depict various aspects of the articles of manufacture disclosed herein. It is understood that these figures depict exemplary embodiments and particular aspects of the disclosed articles of manufacture. The exemplary features illustrated in the figures are intended to represent these aspects of the various disclosed embodiments and not intended to limit the claimed scope to any particular feature. Further, whenever possible, the following description refers to the reference numerals included in the figures, in which features depicted in multiple figures are designated with consistent reference numerals.

DETAILED DESCRIPTION

The following text sets forth a detailed description of numerous different embodiments. However, it is understood that the detailed description is to be construed as exemplary only and does not describe every possible embodiment since describing every possible embodiment would be impractical. In light of the teachings and disclosures herein, numerous alternative embodiments may be implemented.

It is understood that, unless a term is expressly defined in this patent application using the sentence "As used herein, the term '_____' is hereby defined to mean . . . " or a similar sentence, there is no intent to limit the meaning of that term, either expressly or by implication, beyond its plain or ordinary meaning, and such term should not be interpreted to be limited in scope based on any statement made in any section of this patent application.

Figure 1:
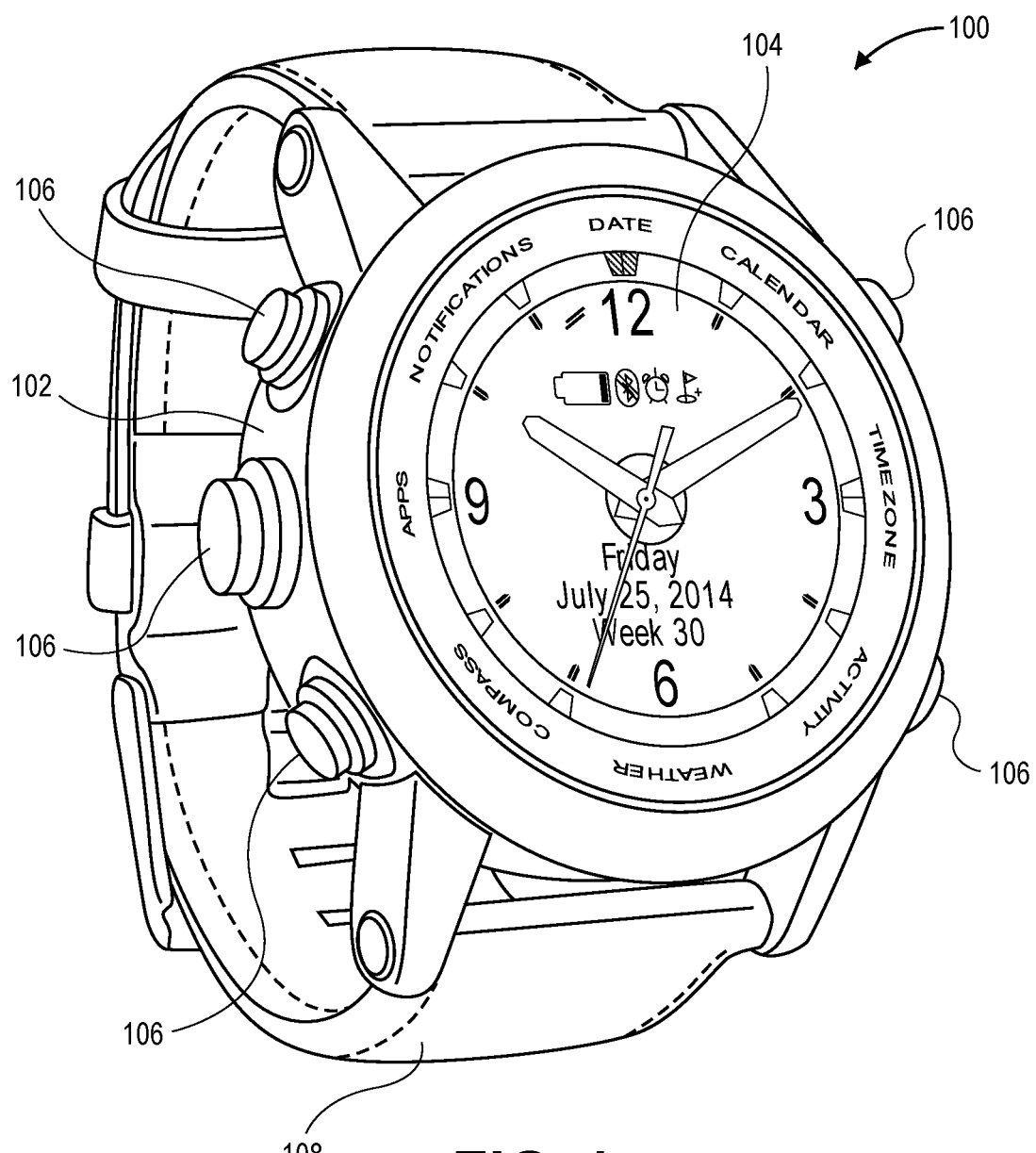
FIG. 1 is a perspective view of a mobile electronic device (in this embodiment a smartwatch 100) in accordance with one or more embodiments of the present disclosure.

FIG. 1 is a perspective view of a mobile electronic device (in this embodiment a smartwatch 100) in accordance with one or more embodiments of the present disclosure. Smartwatch 100 is operable to provide fitness information and/or navigation functionality to a user of the smartwatch 100. The smartwatch 100 may be configured in a variety of ways. For instance, a smartwatch 100 may be configured for use during fitness and/or sporting activities and comprise a cycle computer, a sport watch, a golf computer, a smart phone providing fitness or sporting applications (apps), a hand-held GPS device used for hiking, and so forth. However, it is contemplated that the present teachings can be implemented in connection with any mobile electronic device. Thus, the mobile electronic device may also be configured as a portable navigation device (PND), a mobile phone, a hand-held portable computer, a tablet computer, a personal digital assistant, a multimedia device, a media player, a game device, combinations thereof, and so forth. In the following description, a referenced component, such as mobile electronic device or specifically, smartwatch 100, may refer to one or more entities, and therefore by convention reference may be made to a single entity (e.g., the smartwatch 100) or multiple entities (e.g., the smartwatches 100, the plurality of smartwatches 100, and so on) using the same reference number.

The smartwatch 100 includes a housing 102. The housing 102 is configured to house, e.g., substantially enclose, various components of the smartwatch 100. The housing 102 may be formed from a lightweight and impact-resistant material such as metal or a metal alloy, plastic, nylon, or combinations thereof, for example. The housing 102 may be formed from a non-conductive material, such a non-metal material, for example. The housing 102 may include one or more gaskets, e.g., a seal, to make it substantially waterproof or water resistant. The housing 102 may include a location for a battery and/or another power source for powering one or more components of the smartwatch 100. The housing 102 may be a singular piece or may include a plurality of sections. In embodiments, the housing 102 may be formed from a conductive material, such as metal, or a semiconductive material.

In various embodiments, the smartwatch 100 includes a viewing area 104. The viewing area 104 may include a liquid crystal display (LCD), a thin film transistor (TFT), a light-emitting diode (LED), a light-emitting polymer (LEP), and/or a polymer light-emitting diode (PLED). However, embodiments are not so limited. In various embodiments, the viewing area 104 includes one or more analog or mechanical presentation indicators, such as analog watch hands or mechanical complications or other mechanical gauge or dial indicators. In these embodiments, the viewing area 104 is used to display text and/or graphical information. The viewing area 104 may be backlit such that it may be viewed in the dark or other low-light environments. However, embodiments are not so limited. The viewing area 104 may be enclosed by a transparent lens or cover layer that covers and/or protects components of the smartwatch 100. The viewing area 104 may be backlit via a backlight such that it may be viewed in the dark or other low-light environments. The viewing area 104 may be provided with a touch screen to receive input (e.g., data, commands, etc.) from a user. For example, a user may operate the smartwatch 100 by touching the touch screen and/or by performing gestures on the screen. In some embodiments, the touch screen may be a capacitive touch screen, a resistive touch screen, an infrared touch screen, combinations thereof, and the like. The smartwatch 100 may further include one or more input/output (I/O) devices (e.g., a keypad, buttons, a wireless input device, a thumbwheel input device, a trackstick input device, and so on). The I/O devices may include one or more audio I/O devices, such as a microphone, speakers, and so on.

As noted above, in various embodiments, the smartwatch 100 includes one or more mechanical watch hands (e.g., hour hand, minute hand, second hand, and so on) or mechanical complications (date, calendar, dial indicator, and so on). These mechanical watch hands or mechanical complications may be driven by electric motors or other mechanical structures (e.g., spring, wheel, and so on).

The smartwatch 100 may also include a communication module representative of communication functionality to permit smartwatch 100 to send/receive data between different devices (e.g., components/peripherals) and/or over the one or more networks. The communication module may be representative of a variety of communication components and functionality including, but not limited to: one or more antennas; a browser; a transmitter and/or receiver; a wireless radio; data ports; software interfaces and drivers; networking interfaces; data processing components; and so forth. The smartwatch 100 may be configured to communicate via one or more networks with a cellular provider and an Internet provider to receive mobile phone service and various content, respectively. Content may represent a variety of different content, examples of which include, but are not limited to: map data, which may include route information; web pages; services; music; photographs; video; email service; instant messaging; device drivers; real-time and/or historical weather data; instruction updates; and so forth.

The one or more networks are representative of a variety of different communication pathways and network connections which may be employed, individually or in combinations, to communicate among various components. Thus, the one or more networks may be representative of communication pathways achieved using a single network or multiple networks. Further, the one or more networks are representative of a variety of different types of networks and connections that are contemplated including, but not limited to: the Internet; an intranet; a satellite network; a cellular network; a mobile data network; wired and/or wireless connections; and so forth. Examples of wireless networks include, but are not limited to: networks configured for communications according to: one or more standard of the Institute of Electrical and Electronics Engineers (IEEE), such as 802.11 or 802.16 (Wi-Max) standards; Wi-Fi standards promulgated by the Wi-Fi Alliance; Bluetooth standards promulgated by the Bluetooth Special Interest Group; and so on. Wired communications are also contemplated such as through universal serial bus (USB), Ethernet, serial connections, and so forth.

In accordance with one or more embodiments of the present disclosure, the smartwatch 100 includes a control button 106. As illustrated in FIG. 1, the control button 106 is associated with, e.g., adjacent to, the housing 102. While FIG. 1 illustrates four control buttons 106 associated with the housing 102, embodiments are not so limited. For example, the smartwatch 100 may include fewer than four control buttons 106, such as one, two, or three control buttons. Additionally, the smartwatch 100 may include more than four control buttons 106, such as five, six, or seven, for example. The control button 106 is configured to control a function of the smartwatch 100. In various embodiments, regions of the viewing area of the smartwatch 100 are covered with a touch sensor as further described below in connection with FIGS. 3-7. In these embodiments, a touchscreen functions as a user interface component to provide input to the smartwatch 100, when a user touches various surface regions of the touchscreen associated with the smartwatch 100, which regions are configured to control a function of the smartwatch 100.

Figure 2:
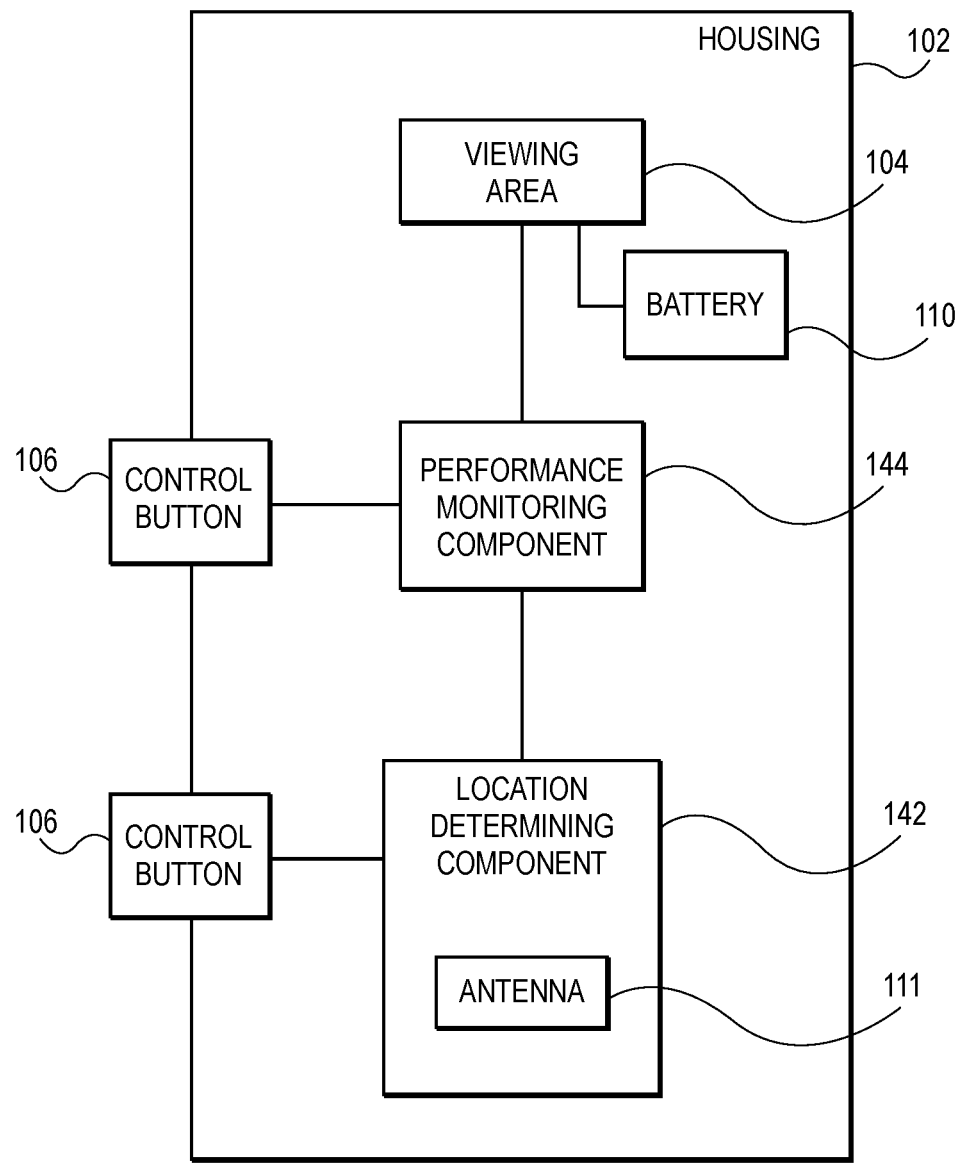
FIG. 2 shows a block diagram of the internal components of an exemplary mobile electronic device such as the smartwatch 100 of FIG. 1, in accordance with various embodiments of the present disclosure.

Functions of the smartwatch 100 may be associated with a location determining component 142 (of FIG. 2) and/or a performance monitoring component 144 (of FIG. 2). Functions of the smartwatch 100 may include, but are not limited to, displaying a current geographic location of the smartwatch 100, mapping a location in the viewing area 104, locating a desired location and displaying the desired location on the viewing area 104, monitoring a user's heart rate, monitoring a user's speed, monitoring a distance traveled, calculating calories burned, and the like. In embodiments, user input may be provided from movement of the housing 102. For example, an accelerometer may be used to identify tap inputs on the housing 102 or upward and/or sideways movements of the housing 102. In embodiments, user input may be provided from touch inputs identified using various touch sensing technologies, such as resistive touch or capacitive touch interfaces.

In accordance with one or more embodiments of the present disclosure, the smartwatch 100 includes a strap 108. As illustrated in FIG. 1, the strap 108 is associated with, e.g., coupled to, the housing 102. For example, the strap 108 may be removably secured to the housing 102 via attachment of securing elements to corresponding connecting elements. Examples of securing elements and/or connecting elements include, but are not limited to hooks, latches, clamps, snaps, and the like. The strap 108 may be made of a lightweight and resilient thermoplastic elastomer and/or a fabric, for example, such that the strap 108 may encircle a portion of a user without discomfort while securing the housing 102 to the user. The strap 108 may be configured to attach to various portions of a user, such as a user's leg, waist, wrist, forearm, and/or upper arm.

FIG. 2 shows a block diagram of the internal components of an exemplary mobile electronic device such as the smartwatch 100 of FIG. 1, in accordance with various embodiments of the present disclosure. The housing 102 can include a location determining component 142 positioned within the housing. For example, the location determining component 142 may include an antenna 111 having a ground plane. The ground plane may be formed by coupling a printed circuit board and/or a conductive cage with the antenna 111. The antenna 111 and the ground plane may be coupled using solder, connection elements, or combinations thereof.

The location determining component 142 may be a GPS receiver that is configured to provide geographic location information of the watch. The location determining component 142 may be, for example, a GPS receiver such as those provided in various products by GARMIN®. Generally, GPS is a satellite-based radio navigation system capable of determining continuous position, velocity, time, and direction information. Multiple users may simultaneously utilize GPS. GPS incorporates a plurality of GPS satellites that orbit the earth. Based on these orbits, GPS satellites can relay their location to a GPS receiver. For example, upon receiving a GPS signal, e.g., a radio signal, from a GPS satellite, the watch disclosed herein can determine a location of that satellite. The watch can continue scanning for GPS signals until it has acquired a number, e.g., at least three, of different GPS satellite signals. The watch may employ geometrical triangulation, e.g., where the watch utilizes the known GPS satellite positions to determine a position of the watch relative to the GPS satellites. Geographic location information and/or velocity information can be updated, e.g., in real time on a continuous basis, for the watch.

The location determining component 142 may also be configured to provide a variety of other position-determining functionality. Location determining functionality, for purposes of discussion herein, may relate to a variety of different navigation techniques and other techniques that may be supported by "knowing" one or more positions. For instance, location determining functionality may be employed to provide position/location information, timing information, speed information, and a variety of other navigation-related data. Accordingly, the location determining component 142 may be configured in a variety of ways to perform a wide variety of functions. For example, the location determining component 142 may be configured for outdoor navigation, vehicle navigation, aerial navigation (e.g., for airplanes, helicopters), marine navigation, personal use (e.g., as a part of fitness-related equipment), and so forth. Accordingly, the location determining component 142 may include a variety of devices to determine position using one or more of the techniques previously described.

The location determining component 142, for instance, may use signal data received via a GPS receiver in combination with map data that is stored in the memory to generate navigation instructions (e.g., turn-by-turn instructions to an input destination or point of interest), show a current position on a map, and so on. Location determining component 142 may include one or more antennas 111 to receive signal data as well as to perform other communications, such as communication via one or more networks. The location determining component 142 may also provide other positioning functionality, such as to determine an average speed, calculate an arrival time, and so on.

The location determining component 142 may include one or more processors, controllers, and/or other computing devices as well as a memory, e.g., for storing information accessed and/or generated by the processors or other computing devices. The processor may be electrically coupled with a printed circuit board and operable to process position determining signals received by the antenna 111. The location determining component 142, e.g., the antenna 111, is configured to receive position determining signals, such as GPS signals from GPS satellites, to determine a current geographic location of the watch. The location determining component 142 may also be configured to calculate a route to a desired location, provide instructions, e.g., directions, to navigate to the desired location, display maps and other information on the display, and to execute other functions, such as, but not limited to, those functions described herein.

The memory may store cartographic data and routing used by or generated by the location determining component 142. The memory may be integral with the location determining component 142, stand-alone memory, or a combination of both. The memory may include, for example, a removable nonvolatile memory card, such as a TransFlash card. The memory is an example of device-readable storage media that provides storage functionality to store various data associated with the operation of the smartwatch 100, such as the software program and code segments mentioned above, or other data to instruct the processor and other elements of the smartwatch 100 to perform the techniques described herein. A wide variety of types and combinations of memory may be employed. The memory may be integral with the processor, stand-alone memory, or a combination of both. The memory may include, for example, removable and non-removable memory elements such as RAM, ROM, Flash (e.g., SD Card, mini-SD card, micro-SD Card), magnetic, optical, USB memory devices, and so forth.

The antenna 111, for example, may be configured to receive and/or transmit a signal, such as a GPS signal. Antenna 111 may be any antenna capable of receiving wireless signals from a remote source, including directional antennas and omnidirectional antennas. Antenna 111 may include any type of antennas in which the length of the ground plane affects the efficiency of the antenna. In accordance with one or more embodiments of the present disclosure, the antenna 111 is an omnidirectional antenna having a ground plane. An omnidirectional antenna may receive and/or transmit in both orthogonal polarizations, depending upon direction. In other words, omnidirectional antennas do not have a predominant direction of reception and/or transmission. Examples of omnidirectional antennas include, but are not limited to, inverted-F antennas (IFAs) and planar inverted-F antennas (PIFAs). In contrast to omnidirectional antennas, directional antennas have a primary lobe of reception and/or transmission over an approximate 70 by 70 degree sector in a direction away from the ground plane. Examples of directional antennas include, but are not limited to, microstrip antennas and patch antennas.

In accordance with one or more embodiments of the present disclosure, the antenna 111 may be an embedded antenna. As used herein, an embedded antenna refers to an antenna that is positioned completely within a device housing. For example, the antenna 111 may be positioned completely within the housing 102. In some embodiments, the antenna 111 may be an external antenna with all or a portion of the antenna 111 exposed from the housing 102.

As discussed, the location determining component 142 includes the antenna 111. The antenna 111 may be associated with, e.g., formed on and/or within, an antenna support assembly. Alternatively, the antenna 111 may be positioned on a top portion or one or more side portions of the antenna support assembly.

The printed circuit board may support a number of processors, microprocessors, controllers, microcontrollers, programmable intelligent computers (PIC), field-programmable gate arrays (FPGA), other processing components, other field logic devices, application specific integrated circuits (ASIC), and/or a memory that is configured to access and/or store information that is received or generated by the watch. The smartwatch 100 may implement one or more software programs to control text and/or graphical information on the display, as discussed herein. As an example, the printed circuit board may support the bottom portion of the antenna support assembly. In some embodiments, the antenna support assembly and antenna 111 may be positioned in the center of the top surface, bottom surface, or to a side of the of the printed circuit board.

A processor may provide processing functionality for the smartwatch 100 and may include any number of processors, micro-controllers, or other processing systems, and resident or external memory for storing data and other information accessed or generated by the smartwatch 100. The processor may execute one or more software programs that implement the techniques and modules described herein. The processor is not limited by the materials from which it is formed or the processing mechanisms employed therein and, as such, may be implemented via semiconductor(s) and/or transistors (e.g., electronic integrated circuits (ICs)), and so forth.

In accordance with one or more embodiments of the present disclosure, functions of the watch may be associated with the location determining component 142 and/or the performance monitoring component 144. For example, the location determining component 142 is configured to receive signals, e.g. position determining signals, such as GPS signals, to determine a position of the watch as a function of the signals. The location determining component 142 may also be configured to calculate a route to a desired location, provide instructions to navigate to the desired location, display maps and/or other information in the viewing area 104, to execute other functions described herein, among other things.

The performance monitoring component 144 may be positioned within the housing 102 and be coupled to the location determining component 142 and the viewing area 104. The performance monitoring component 144 may receive information, including, but not limited to geographic location information, from the location determining component 142, to perform a function, such as monitoring performance and/or calculating performance values and/or information related to a watch user's movement, e.g., exercise. The monitoring of the performance and/or the calculating performance values may be based at least in part on the geographic location information. The performance values may include, for example, a user's heart rate, speed, a total distance traveled, total distance goals, speed goals, pace, cadence, and calories burned. These values and/or information may be presented in the viewing area 104.

In embodiments, the smartwatch 100 includes a user interface, which is storable in memory and executable by the processor. The user interface is representative of functionality to control the display of information and data to the user of the smartwatch 100 in the viewing area 104. In some implementations, a display module within the viewing area 104 may not be integrated into the smartwatch and may instead be connected externally using universal serial bus (USB), Ethernet, serial connections, and so forth. The user interface may provide functionality to allow the user to interact with one or more applications of the smartwatch 100 by providing inputs via the touch screen and/or the I/O devices. For example, the user interface may cause an application programming interface (API) to be generated to expose functionality to an application to configure the application for display in the viewing area 104 or in combination with another display. In embodiments, the API may further expose functionality to configure the application to allow the user to interact with an application by providing inputs via the touch screen and/or the I/O devices. Applications may comprise software, which is storable in memory and executable by the processor, to perform a specific operation or group of operations to furnish functionality to the smartwatch 100. Example applications may include fitness application, exercise applications, health applications, diet applications, cellular telephone applications, instant messaging applications, email applications, photograph sharing applications, calendar applications, address book applications, and so forth.

In various embodiments, the user interface may include a browser. The browser 140 enables the smartwatch 100 to display and interact with content such as a webpage within the World Wide Web, a webpage provided by a web server in a private network, and so forth. The browser may be configured in a variety of ways. For example, the browser may be configured as an application accessed by the user interface. The browser may be a web browser suitable for use by a full resource device with substantial memory and processor resources (e.g., a smart phone, a personal digital assistant (PDA), etc.). However, in one or more implementations, the browser may be a mobile browser suitable for use by a low-resource device with limited memory and/or processing resources (e.g., a mobile telephone, a portable music device, a transportable entertainment device, etc.). Such mobile browsers typically conserve battery energy, memory and processor resources, but may offer fewer browser functions than web browsers.

In various embodiments, the smartwatch 100 includes an energy storage device such as a battery 110. It is understood that this energy storage device could employ any conventional or later developed energy storage or chemical battery technology, such as a supercapacitor, for example employing electrostatic double-layer capacitance and electrochemical pseudocapacitance. In various embodiments the energy storage device or battery 110 includes a lithium polymer battery. As explained in connection with FIG. 1, in various embodiments, the control button 106 is configured to control a function of the smartwatch 100.

Figure 3:
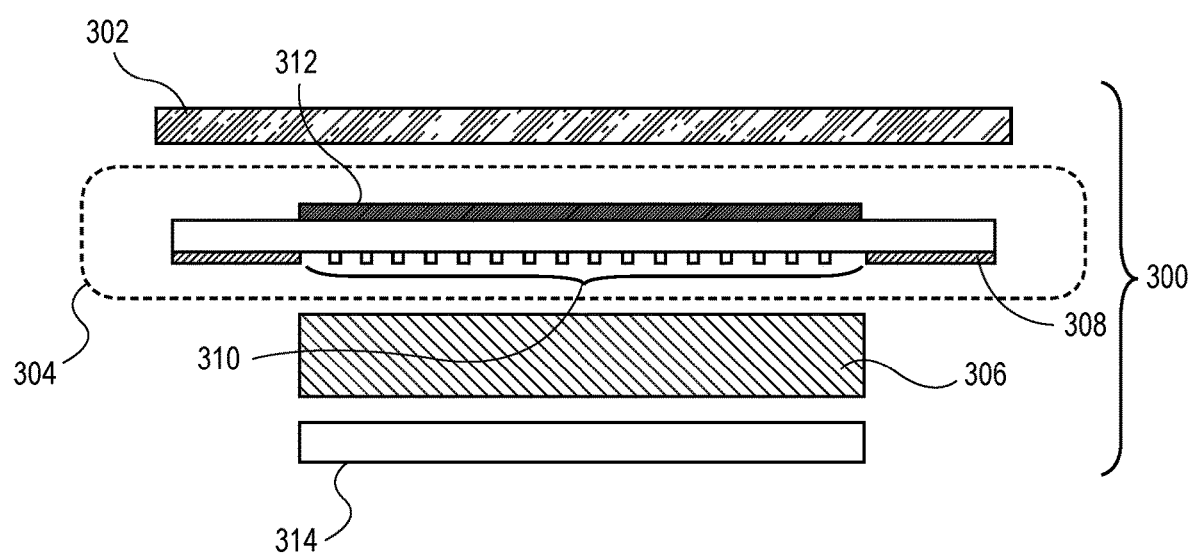
FIG. 3 illustrates the various layers of an energy-collecting touchscreen unit 300 in accordance with an embodiment of the present disclosure.

FIG. 3 illustrates the various layers of an energy-collecting touchscreen unit 300 in accordance with an embodiment of the present disclosure. In various embodiments, a thin, substantially transparent lens or cover layer 302 is provided. A viewing area within the touchscreen unit can be observed through the cover layer 302, while the cover layer 302 protects the touchscreen unit 300 from physical damage. Moreover, in various embodiments extremely robust, scratch-resistant, and substantially transparent materials are employed, such as sapphire glass which is a synthetically produced crystal that is well-suited for use in touchscreens. In various alternate embodiments, the cover layer 302 is made of Gorilla Glass™ from Corning Incorporated from Corning, N.Y.

In various embodiments, a common base layer 304 is provided immediately beneath the cover layer 302. In various embodiments, an air gap between the cover layer 302 and the common base layer 304 is filled a with substantially transparent optical bonding agent. It is understood that the cover layer can be arbitrarily thin, integral to, and forming a part of the common base layer 304. In an embodiment, the common base layer 304 has a touch sensor 312 that can be used to sense touch at the surface of the touchscreen unit 300. In various embodiments, the common base layer 304 is made of borosilicate glass. In an embodiment, the touch sensor is a capacitive touch panel ("CTP") made of a transparent conductive material such as indium tin oxide ("ITO") patterned in an array upon the upper face of the common base layer 304 and, in various embodiments, further processed to facilitate the electrical interconnections.

Figure 6:
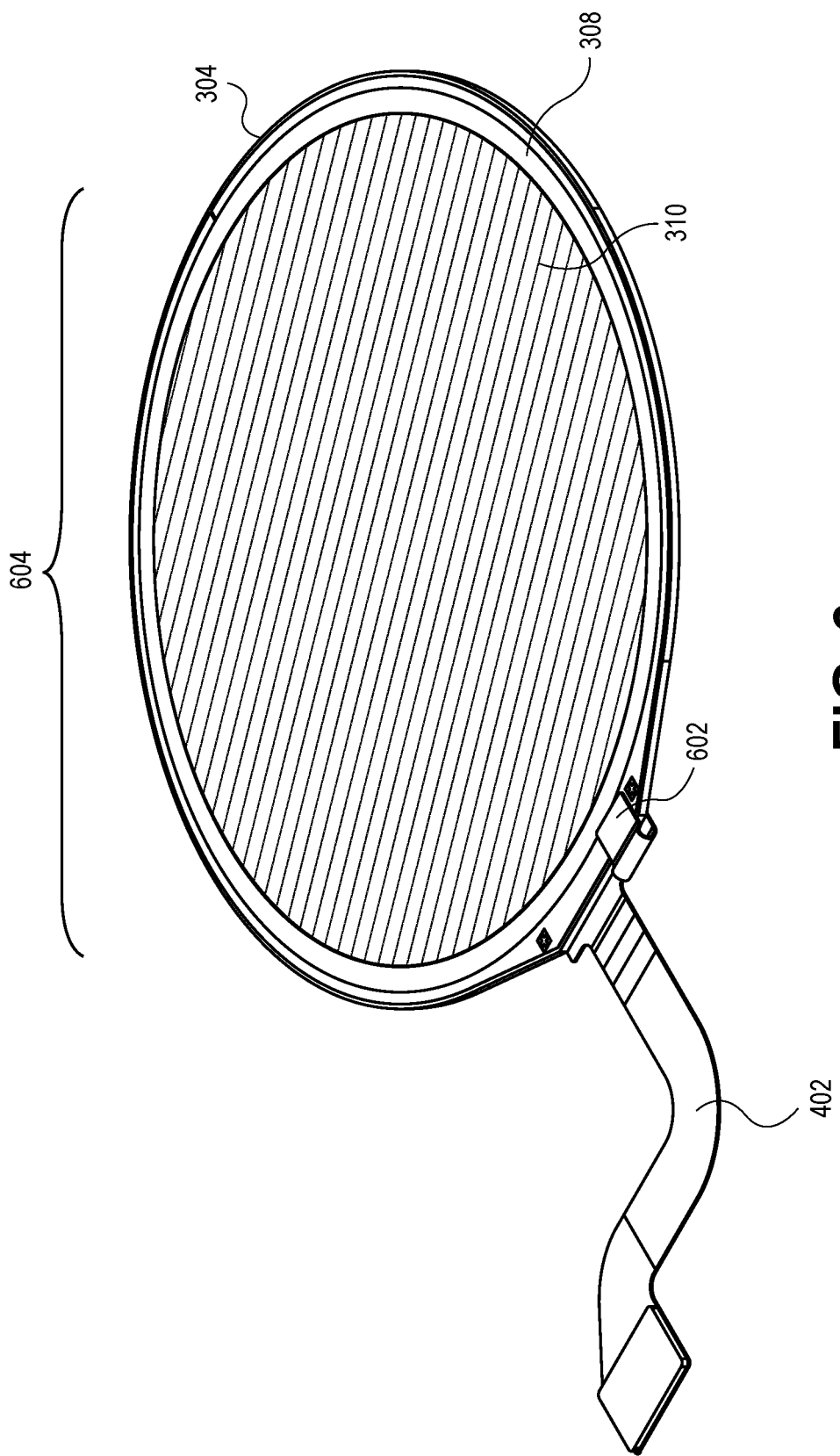
FIGS. 6 and 7 illustrate a photovoltaic surface on a bottom face of a common base layer, in accordance with various embodiments of the present disclosure.
Figure 7:
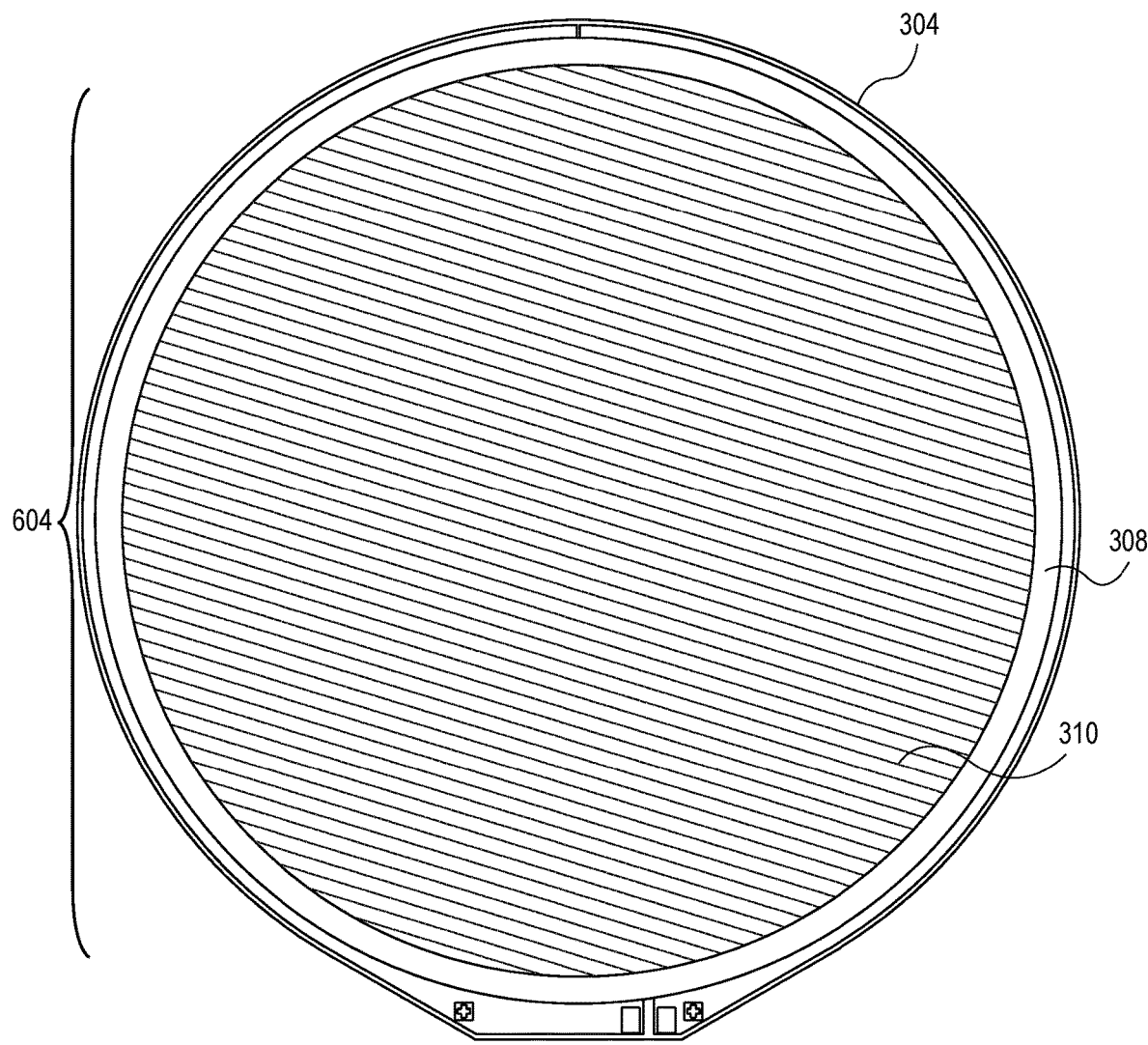

In various embodiments, the bottom face of the common base layer 304 has deposited on it materials which provide it with photovoltaic properties. In various embodiments, photovoltaic surface 604 (as shown in FIGS. 6 and 7) is made up of an exterior portion 308 and an interior portion 310. In an embodiment, the exterior portion 308 is substantially continuous, meaning that the layer is substantially intact and not etched. By contrast, in various embodiments, the interior portion 310 is photoetched away (as further described in connection with FIGS. 6 and 7) so that only a minor portion of it actually covers the surface of the common base layer 304.

In an embodiment, display module 306 is provided beneath the common base layer 304. In various embodiments, the display module 306 is a liquid crystal pixel array having a pixel pitch of 126.9 µm with each pixel being made up of 9 apertures, 3 apertures for each color sub-pixel. In an embodiment, there is 5 µm gap between the apertures. In various embodiments, it is possible to superimpose 10 µm wide strips of photovoltaic material such that only 10% of the area of the display module 306 is blocked and the brightness and contrast of the display is only minimally impacted. In an embodiment, the strips of photovoltaic material are superimposed over the columns of the display pixels at a 25 degree tilt angle resulting in a minimal Moire consequence.

In various embodiments, the composite photovoltaic surface 604, which is made up of the exterior portion 308 and the interior portion 310, is circular or substantially congruent to the shape of the face of the smartwatch 100 or other portable electronic device. In various embodiments, the exterior portion 308 is made up of an annular ring of substantially continuous photovoltaic material along the distal perimeter of the display. Further, the interior portion 310 of photovoltaic material s dispersed in a pattern across the interior portion 310 of the common base layer 304 so as to minimally obscure viewing of a viewing area within the touchscreen unit 300. The photovoltaic surface 604 is positioned on the bottom face of the common base layer 304 between the display module 306 and the common base layer 304. The touch sensor is deposited upon the upper face of the common base layer 304. In various embodiments, a backlight 314 is provided so the display module 306 is visible in dark or relatively low-light environments.

Figure 4:
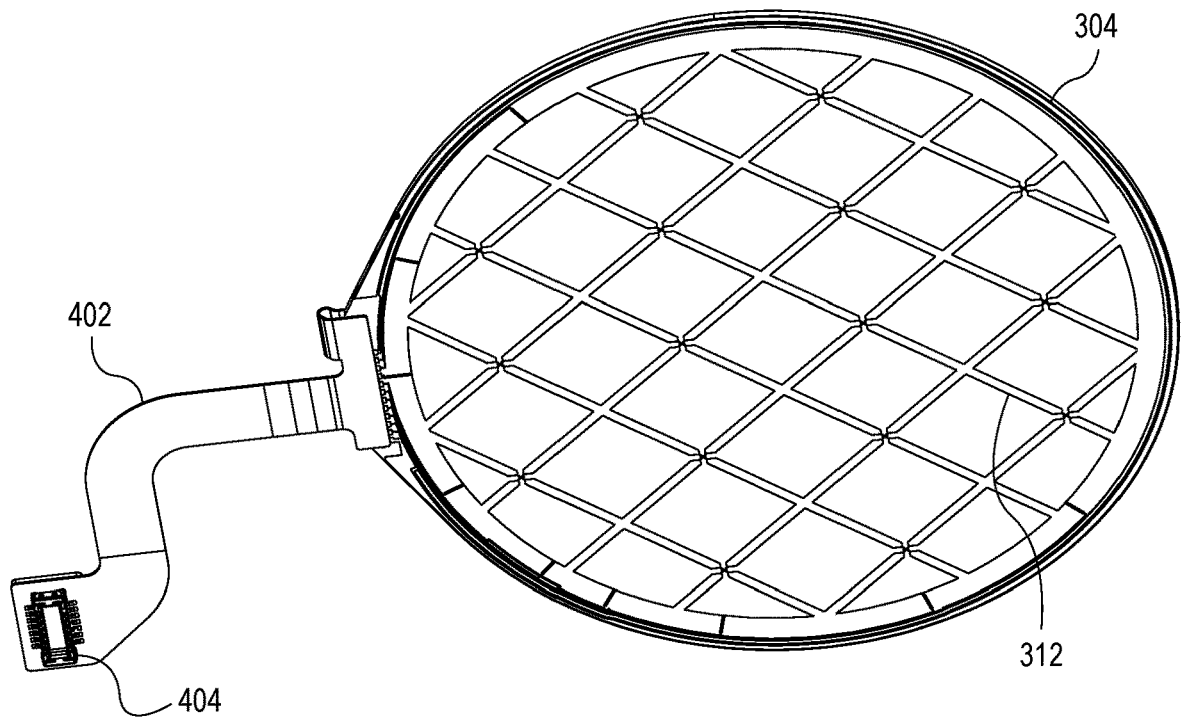
FIGS. 4 and 5 illustrate a touch sensor on an upper face of a common base layer, in accordance with various embodiments of the present disclosure.
Figure 5:
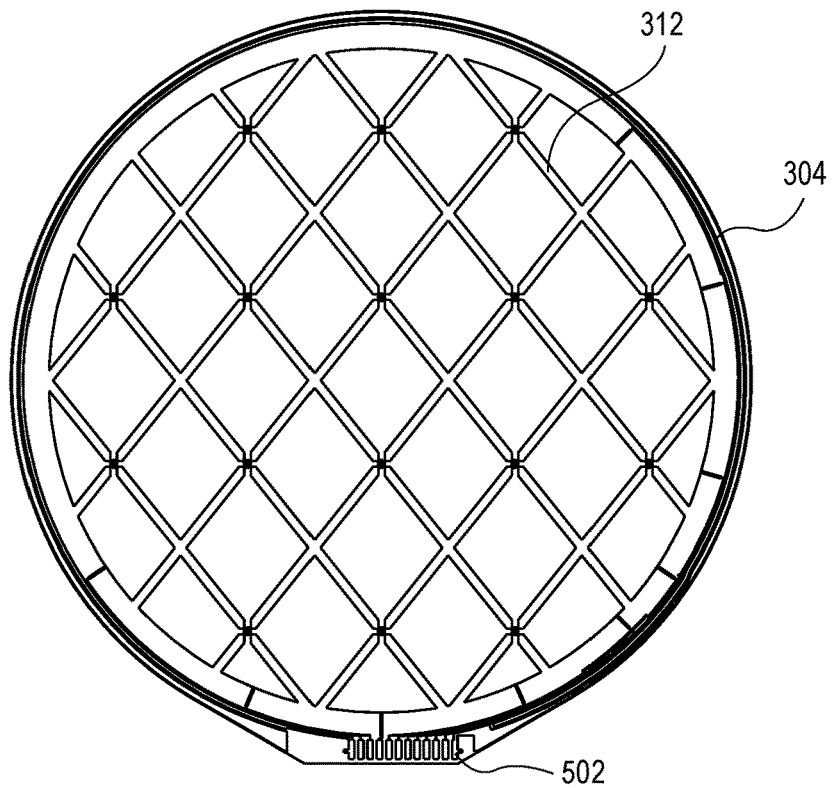

FIGS. 4 and 5 illustrate a touch sensor 312 on a front face of the common base layer 304, in accordance with various embodiments of the present disclosure. In various embodiments the touchscreen aspect of the portable electronic device is provided as by means of a CTP made up of an ITO array on the upper surface of the common base layer 304 shown in FIG. 5.

Additionally, an electrical interconnection, such as a flexible printed circuit 402, may be provided with connector 404 that can be connected to electronics associated with the smartwatch 100 such as the performance monitoring component 144 as shown in FIG. 2. In configurations, the electrical interconnection connects the photovoltaic surface 604 and the touch sensor 312. In addition to, or as an alternative to, flexible printed circuit 402, the electrical interconnection may include spring contacts (e.g., pogo pins), discrete wires, rigid connectors, combinations thereof, and the like to join the electronics associated with the watch 100 with the photovoltaic surface 604 and touch sensor 312.

In various embodiments, contact pads 502 made from ITO are provided on the glass surface for electrically interconnecting with the flexible printed circuit 402. In various embodiments, contact pads made of plated copper are provided on the flexible printed circuit 402 to facilitate this electrical interconnection. In various embodiments, anisotropic conductive film ("ACF") material which acts like a conductive glue is provided to bond the glass to the flexible printed circuit 402. In various embodiments, the CTP array works by sensing differences in capacitance between the ITO areas of the touch sensor 312 of FIGS. 4 and 5. The flexible printed circuit cable 402 has the connector 404 mounted on it in such a way that the cable 402 can conveniently be folded under the common base layer 304 and plugged into the electronics of the smartwatch 100 before the enclosure 102 (of FIG. 1) is sealed closed. In various embodiments, the CTP of the top face of the common base layer 304 is either affixed to the cover layer 302 or in very close proximity. In order to improve capacitive touch sensitivity, the distance between the ITO touch sensor (the indium tin oxide pattern on the glass) and the touching object being sensed (e.g. a human finger) is minimized. Additionally, sensitivity is enhanced by minimizing a dielectric constant of the materials in that gap. In various embodiments, for a wearable application such as the smartwatch 100, the touch sensor 312 can sense through air gaps between a lens or similar cover layer 302. It is understood that the touch sensor 312 operates sub-optimally through layers that are conductive or hold an electrical charge. Where an electrical charge builds up on the cover layer 302, with for example an additional anti-glare coating (not shown), the touch sensor 312 may fail to operate properly when exposed to direct sunlight, for which reason, consistent with the present teachings, materials are selected that do not hold a substantial electrical charge.

As set forth above, capacitive touch sensitivity is increased by minimizing the dielectric constant of the combination of materials between the touch sensor 312 and the thing being sensed (typically a finger). By way of reference the dielectric constant of ambient air is approximately 1.0 (relative permittivity), while sapphire is about 10 and glass is about 5, with conductive metals having a dielectric constant that is basically infinite. Accordingly, it is understood that, while glass, such as borosilicate glass, allows for greater touch sensitivity than some harder materials, it lacks the protective qualities of sapphire. Accordingly, a material for cover layer 302 is selected to provide the most physical protection while still providing adequate touch sensitivity. In this way, a position at which a finger or other capacitive pointing device touches the surface of the cover layer 302 can be accurately determined by changes in the capacitance measured in the ITO pattern and transmitted to various pins of connector 404.

FIGS. 6 and 7 illustrate a photovoltaic surface 604 on a front face of the common base layer 304, in accordance with various embodiments of the present disclosure. In various embodiments, the photovoltaic surface 604 is formed from one or more layers of doped amorphous silicon which has the advantages of low cost as well as low toxicity compared to some other photovoltaic materials, but it is understood that other photovoltaic materials may be employed without departing from the present teachings. In various embodiments the pattern of the interior portion 310 of the photovoltaic surface 604 is formed by first depositing a substantially uniform layer or layers of photovoltaic material and then removing desired portions of the material by way of photoetching.

In various embodiments, photovoltaic energy is transmitted through the cover layer 302 and the ITO array of touch sensor 312 (as well as the common base layer 304) into the photovoltaic layer made up of the exterior portion 308 and the interior portion 310 of the photovoltaic surface 604 thus generating electrical current and, therefore, energy in the photovoltaic layer which is then collected by way of conductors at tab 602 and through the flexible printed circuit cable 402 to be stored in an energy storage device as described in connection with the battery 110 of FIG. 2. Tab 602 is bonded to the common base layer 304 with ACF to provide an electrical interconnection to the flexible cable 402.

Although the foregoing text sets forth a detailed description of numerous different embodiments, it is understood that the detailed description is to be construed as exemplary only and does not describe every possible embodiment because describing every possible embodiment would be impractical, if not impossible. In light of the foregoing text, numerous alternative embodiments may be implemented, using either current technology or technology developed after the filing date of this patent application.

What is claimed is:

1. An energy-collecting touchscreen unit comprising:
a thin, substantially transparent cover layer through which a viewing area within the touchscreen unit can be observed while protecting the touchscreen unit from physical damage;
a common base layer disposed beneath the cover layer, the common base layer having at least one touch sensor and a photovoltaic surface, the touch sensor and the photovoltaic surface being affixed to opposite faces of the common base layer; and
an electrical interconnection with both the photovoltaic surface and the touch sensor,
wherein the electrical interconnection includes a flexible printed-circuit cable comprising a surface-mount interconnection to the touch sensor at the upper face of the common base layer and a tab portion that wraps around an edge of the common base layer to provide electrical interconnection to the photovoltaic surface.

2. The touchscreen unit of claim 1, further comprising a display module positioned beneath the common base layer, wherein the photovoltaic surface comprises an exterior portion of substantially continuous photovoltaic material along a distal perimeter of the common base layer and an interior portion of photovoltaic material that is dispersed in a pattern across an interior portion of the common base layer so as to minimally obscure viewing of the viewing area, wherein the photovoltaic surface is disposed upon a bottom face of the common base layer between the display module and the common base layer, and wherein the touch sensor is deposited upon an upper face of the common base layer between the cover layer and the common base layer.

3. The touchscreen unit of claim 2, wherein the display module is a substantially reflective liquid crystal display.

4. The touchscreen unit of claim 3 further comprising a backlight.

5. The touchscreen unit of claim 2, wherein the dispersed pattern of the photovoltaic material is formed by removing portions of the photovoltaic material by way of photoetching.

6. The touchscreen unit of claim 1, wherein the electrical interconnection includes a flexible cable configured for connection to a processor.

7. The touchscreen unit of claim 1, wherein the cover layer comprises sapphire glass.

8. The touchscreen unit of claim 1, wherein the touch sensor comprises a capacitive touch panel having traces comprising an indium tin oxide array.

9. The touchscreen unit of claim 1, wherein the photovoltaic layer comprises at least one layer of amorphous silicon.

10. The touchscreen unit of claim 1, wherein the common base layer comprises borosilicate glass.

11. An energy-collecting touchscreen unit comprising:
a thin, substantially transparent cover layer through which a viewing area within the touchscreen unit can be observed while protecting the touchscreen unit from physical damage;
a common base layer disposed beneath the cover layer, the common base layer having at least one touch sensor and a photovoltaic surface, the touch sensor and the photovoltaic surface being affixed to opposite faces of the common base layer;
a display module positioned beneath the common base layer; and
at least one flexible cable electrically interconnected with both the photovoltaic surface and the touch sensor,
wherein the photovoltaic surface comprises an exterior portion of substantially continuous photovoltaic material along a distal perimeter of the common base layer and an interior portion of photovoltaic material that is dispersed in a pattern across an interior portion of the common base layer so as to minimally obscure viewing of the viewing area, wherein the photovoltaic surface is disposed upon a bottom face of the common base layer between the display module and the common base layer, and wherein the touch sensor is deposited upon an upper face of the common base layer,
wherein the flexible cable is a flexible printed-circuit cable comprising a surface-mount interconnection to the touch sensor at the upper face of the common base layer and a tab portion that wraps around an edge of the common base layer to provide electrical interconnection to the photovoltaic surface.

12. The touchscreen unit of claim 11, wherein the touch sensor comprises a capacitive touch panel having traces comprising at least one indium tin oxide array.

13. The touchscreen unit of claim 11, wherein the photovoltaic layer comprises at least one layer of amorphous silicon.

14. The touchscreen unit of claim 11, wherein the common base layer comprises borosilicate glass.

15. The touchscreen unit of claim 11, wherein the dispersed pattern of the photovoltaic material is formed by removing portions of the photovoltaic material by way of photoetching.

16. An energy-collecting touchscreen unit comprising:
a thin, substantially transparent cover layer through which a viewing area within the touchscreen unit can be observed while protecting the touchscreen unit from physical damage;
a common base layer disposed beneath the cover layer, the common base layer having at least one touch sensor and a photovoltaic surface, the touch sensor and the photovoltaic surface being affixed to opposite faces of the common base layer;
a backlight positioned below the viewing area; and
at least one flexible cable electrically interconnected with both the photovoltaic surface and the touch sensor,
wherein the photovoltaic surface comprises an exterior portion of substantially continuous photovoltaic material along a distal perimeter of the common base layer and an interior portion of photovoltaic material that is dispersed in a pattern across an interior portion of the common base layer so as to minimally obscure viewing of the viewing area, wherein the photovoltaic surface is disposed upon a bottom face of the common base layer between the viewing area and the common base layer, wherein the touch sensor is deposited upon an upper face of the common base layer, and wherein the flexible cable is a flexible printed-circuit cable comprising a surface-mount interconnection to the touch sensor at the upper face of the common base layer and a tab portion that wraps around an edge of the common base layer to provide electrical interconnection to the photovoltaic surface.

17. The touchscreen unit of claim 16, wherein the touchscreen unit is integrated in a wearable portable electronic device.

18. The touchscreen unit of claim 17, wherein the wearable portable electronic device is a smartwatch.

\* \* \* \* \*